US006414250B1

(12) United States Patent
Inoue et al.

(10) Patent No.: US 6,414,250 B1
(45) Date of Patent: Jul. 2, 2002

(54) HERMETIC MULTI-LAYERED CIRCUIT ASSEMBLIES AND METHOD OF MANUFACTURE

(75) Inventors: Hiroo Inoue, North Mankato; Michael Howieson, Good Thunder; Mark Brooks, North Mankato, all of MN (US)

(73) Assignee: Thin Film Technology Corp., North Mankato, MN (US)

( * ) Notice: Subject to any disclaimer, the term of this patent is extended or adjusted under 35 U.S.C. 154(b) by 0 days.

(21) Appl. No.: 09/752,999

(22) Filed: Dec. 30, 2000

(51) Int. Cl.[7] ............................................. H01R 12/04
(52) U.S. Cl. ...................... 174/261; 174/255; 257/701; 257/700; 333/246
(58) Field of Search ................................ 174/261, 255; 361/719, 795; 257/700, 692, 701, 728; 29/592.1; 428/209, 930; 333/246, 247

(56) References Cited

U.S. PATENT DOCUMENTS

| 5,475,465 A | * | 12/1995 | Bhattacharyya et al. ..... 361/719 |
| 5,476,719 A | * | 12/1995 | Sandell et al. ............... 428/930 |
| 5,510,758 A | * | 4/1996 | Fujita et al. ................. 257/778 |
| 6,098,282 A | * | 8/2000 | Frankeny et al. ........... 174/255 |

* cited by examiner

Primary Examiner—Albert W. Paladini
(74) Attorney, Agent, or Firm—DL Tschida

(57) ABSTRACT

Thin film, multi-layered components wherein the layers are hermetically sealed with a re-flowed conductive sealant (e.g. Pb/Sn solder). The sealant is applied to an endless ground conductor at the peripheral edge of at least one of each pair of opposed substrate layers prior to registering the conductors and re-flowing the sealant. The microstrip conductors comprise thin film adhesion and seed layers and a covering metalization. The signal and ground conductors are terminated with solder balls and the signal and ground conductors are connected with micro vias that extend through the substrates.

19 Claims, 6 Drawing Sheets

HERMETIC MULTI-LAYERED CIRCUIT ASSEMBLIES AND METHOD OF MANUFACTURE

BACKGROUND OF INVENTION

The present invention relates to packaging assemblies for electrical circuits and, in particular, to multi-layered circuit assemblies that are hermetically sealed with a reflowed solder seal at the interface between each pair of overlapping layers.

A variety of methods exist for creating thin film circuits, such as transmission line type delay lines, oscillators, filters etc., using strip lines and micro-strip conductors. Many of these circuits are constructed as multi-layered structures from conductive materials that are deposited, patterned, etched and formed on suitable substrate materials, for example, ceramic or polymer sheets. Circuit terminations are provided that are compatible with the printed circuit mounting.

A primary necessity of the foregoing and many other types of multi-layer circuitry is that they must be mounted in environmentally insensitive packaging. Coatings of conventional encapsulants or outer covers are provided to protect the circuitry from the ambient environment. Most assemblies use polymer encapsulants that are conformally coated or molded to each layer and/or a cover assembly to protect the physical and electrical integrity of the circuitry. Covers may also be secured around all or a substantial portion of the assembled packages.

Problems can arise, however, if humidity is trapped inside or penetrates the packaging. For example, moisture can be trapped in the assembly. Moisture can also migrate into the assembly, if the encapsulant does not seal to the assembly or if pinholes are present in the encapsulant. Circuit reliability is thereby compromised due to possible open or short circuit conditions that can develop.

The encapsulant also adds undesired mass and bulk to the component packaging. Advantageous assemblies of reduced sizes can be constructed if the encapspulant can be avoided. Process complexity can then also be reduced with consequent savings in processing time and improved yields.

Depending upon the circuit assembly, package size is also affected by the necessary input and output circuit terminations that are distributed around the peripheral surfaces of the assembly. The number of terminations can add extra size, especially for products having J-shaped and gull wing-shaped terminations. Lead terminations also introduce possible impedance mismatch and unnecessary signal loss due to the extra length and complicated connections to the internal circuitry.

The present invention was developed to provide hermetically sealed circuit assemblies that don't require a conformal or molded encapsulant. Instead, hermetic seals are formed between the substrates of the laminated layers and at any cover pieces with a re-flowable material (e.g. metal alloy solders or other materials compatible with the substrate material and/or conductive paths). The internal layers and circuitry are connected with through vias that extend through the substrates. In one preferred surface mount package configuration, the conductors terminate at an array of spherical or ball shaped solder terminations known as a ball grid array (BGA) at the bottom surface of the assembly. Circuit integrity is thereby insured and package size is reduced with the present hermetically sealed, multi-layer assemblies.

SUMMARY OF INVENTION

It is a primary object of the invention to provide hermetically sealed multi layered circuit assemblies that do not require separate polymer encapsulation at the individual layers.

It is a further object of the invention to interconnect the layers and transmission line conductors with vias that extend through the substrates.

It is a further object of the invention to provide a hermetic seal using a re-flowable metal alloy solder (e.g. a Sn/Pb solder) that is thermally re-flowed and compressed under controlled conditions of time, temperature and pressure in the presence of suitable gas compositions.

It is a further object of the invention to seal the spaces between the layers of a multi-layer assembly with aligned endless paths of an appropriate material around the peripheries of two opposed layers (e.g. metal or metal alloy rings) and coating at least one of the endless paths with a sealant, such as a solder, and re-flowing the sealant to bond with the opposed path.

It is a further object of the invention that the seal be electrically conductive, for example, serving as a ground connector for the component.

The foregoing objects, advantages and distinctions of the invention are obtained in multi-layered thin film transmission line assemblies wherein at least one endless strip conductor is deposited around the periphery of one substrate at the interface between each pair of adjoining layers. A metal alloy solder compatible with the strip conductors and surface of the opposite substrate is introduced to flow between the adjoining layers to seal the interstitial space between the layers. The opposing layers can provide one or more endless conductive paths that overlap each other or an opposite ground plane or other endless, non-electrical structure compatible with the sealant.

DESCRIPTION OF THE PREFERRED EMBODIMENT

Figure 1:
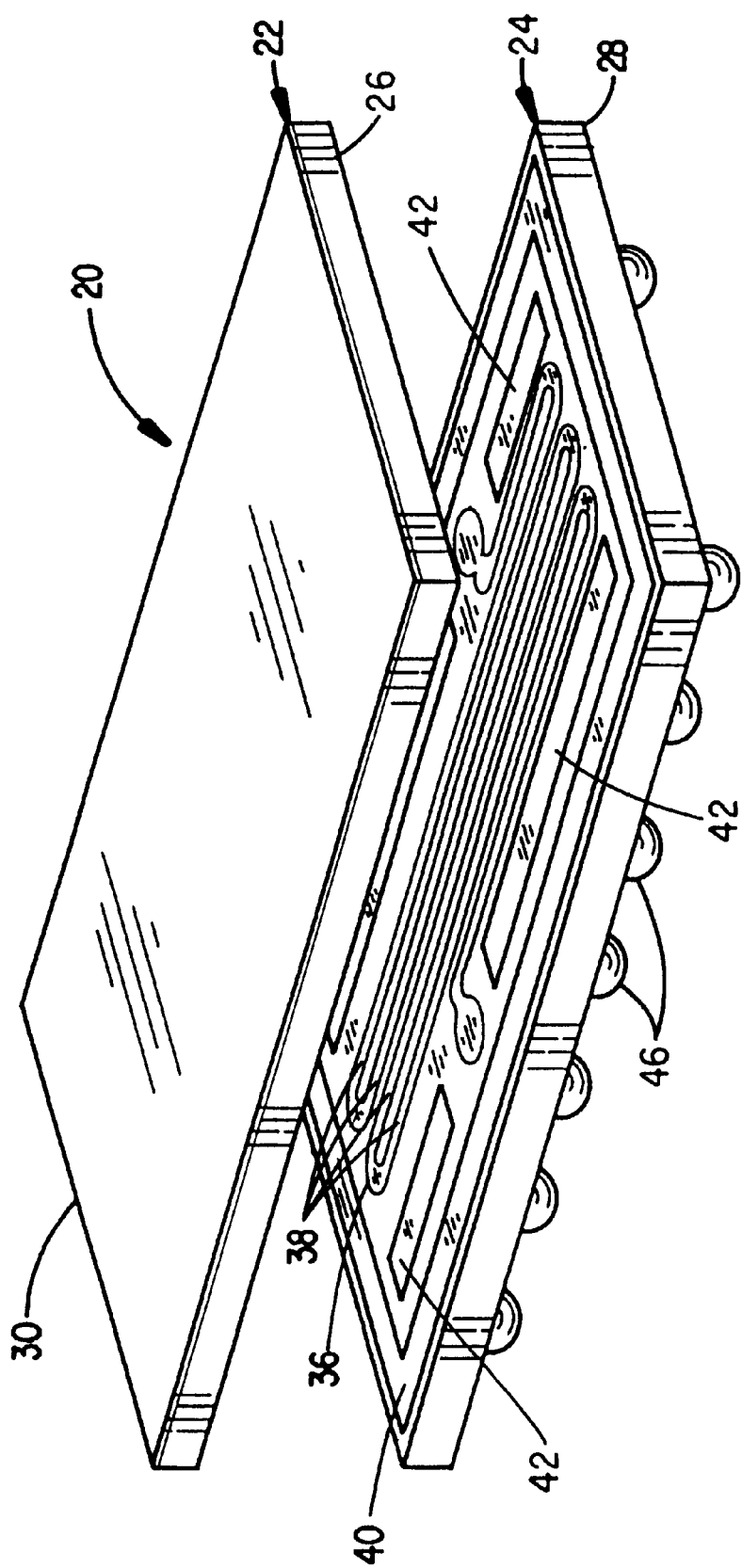
FIG. 1 is an exploded assembly view of a typical 2-layer, hermetically sealed circuit assembly of the invention.
Figure 2:
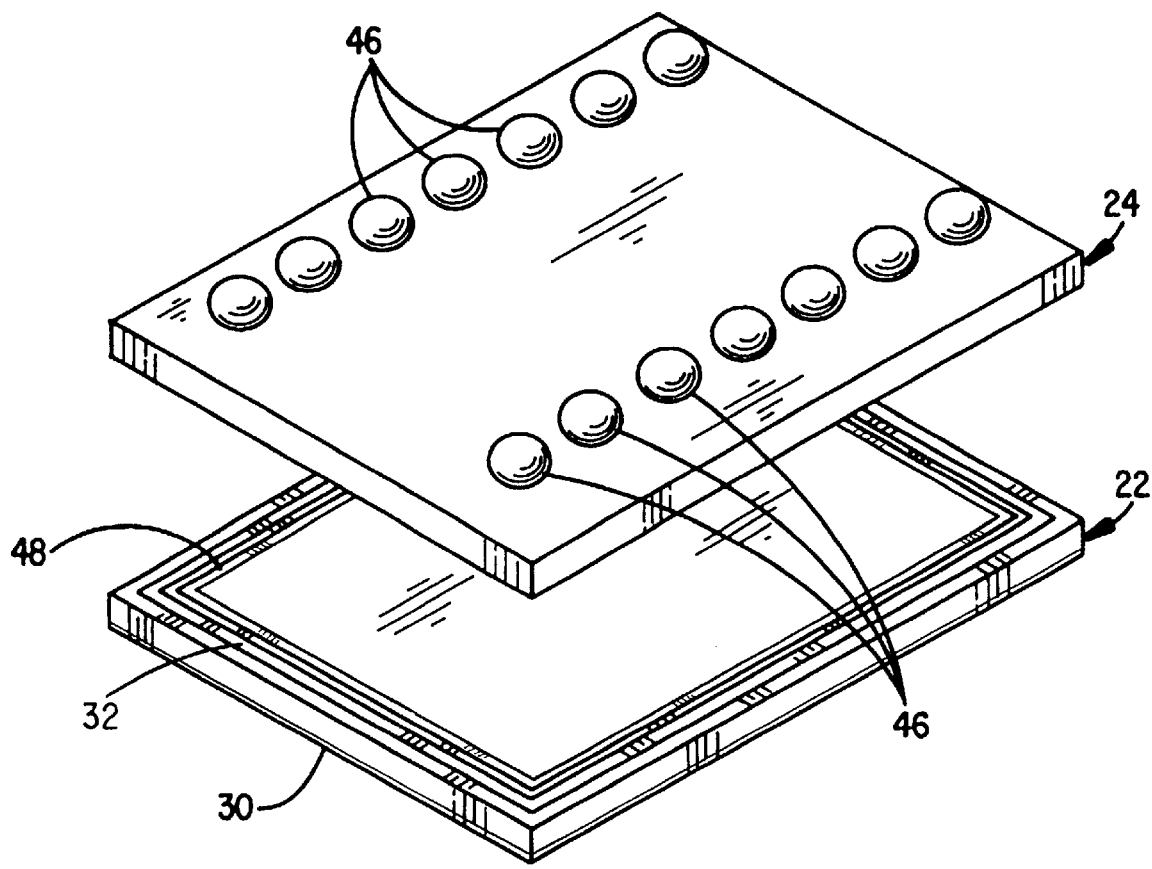
FIG. 2 is an inverted exploded assembly view of FIG. 1 showing a BGA termination array at the bottom surface of the assembly and the backside of the top layer.
Figure 3:
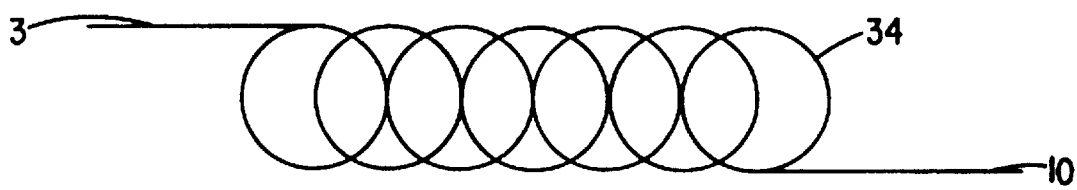
FIG. 3 is a circuit diagram of the signal conductor deposited on FIG. 1.
Figure 3:
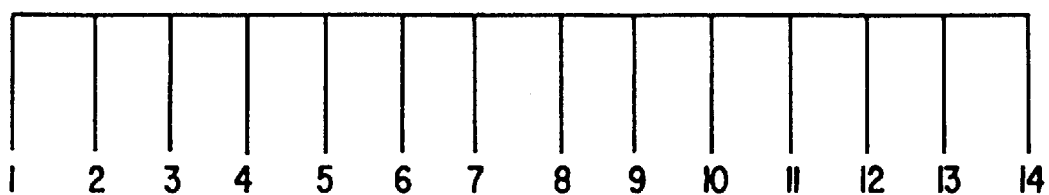

Referring to FIGS. 1 and 2, an exemplary two layer, delay line circuit assembly 20 is shown. The corresponding circuit schematic and circuit terminations 1–14 are shown at FIG. 3. The assembly 20 is constructed of two layers, a ground layer 22 and a signal layer 24. Patterned conductive paths at the layers 22 and 24 are formed over dielectric substrates 26 and 28. A ceramic material, such as an aluminum oxide, is used to form the substrates 26 and 28 for transmission line structures. A polymer resin board substrate material, among other conventional substrate materials, may also be used. A number of layers 22 and 24 are typically formed on larger size pieces of substrate material and from which the layers 22 and 24 are typically diced with a dicing wheel or scribed with a laser beam, prior to breaking the larger substrate into the individual layers 22 and 24.

A ground plane 30 substantially covers the top surface of the ground top layer 22. An endless strip conductor 32, shown at FIG. 2, circumscribes the periphery of the bottom surface of the layer 22. The strip conductor 32 can exhibit any desired shape. A second strip conductor 48 can also be formed at the layer 22 in adjacent registry (e.g. concentric) to the conductor 32.

Figure 6:
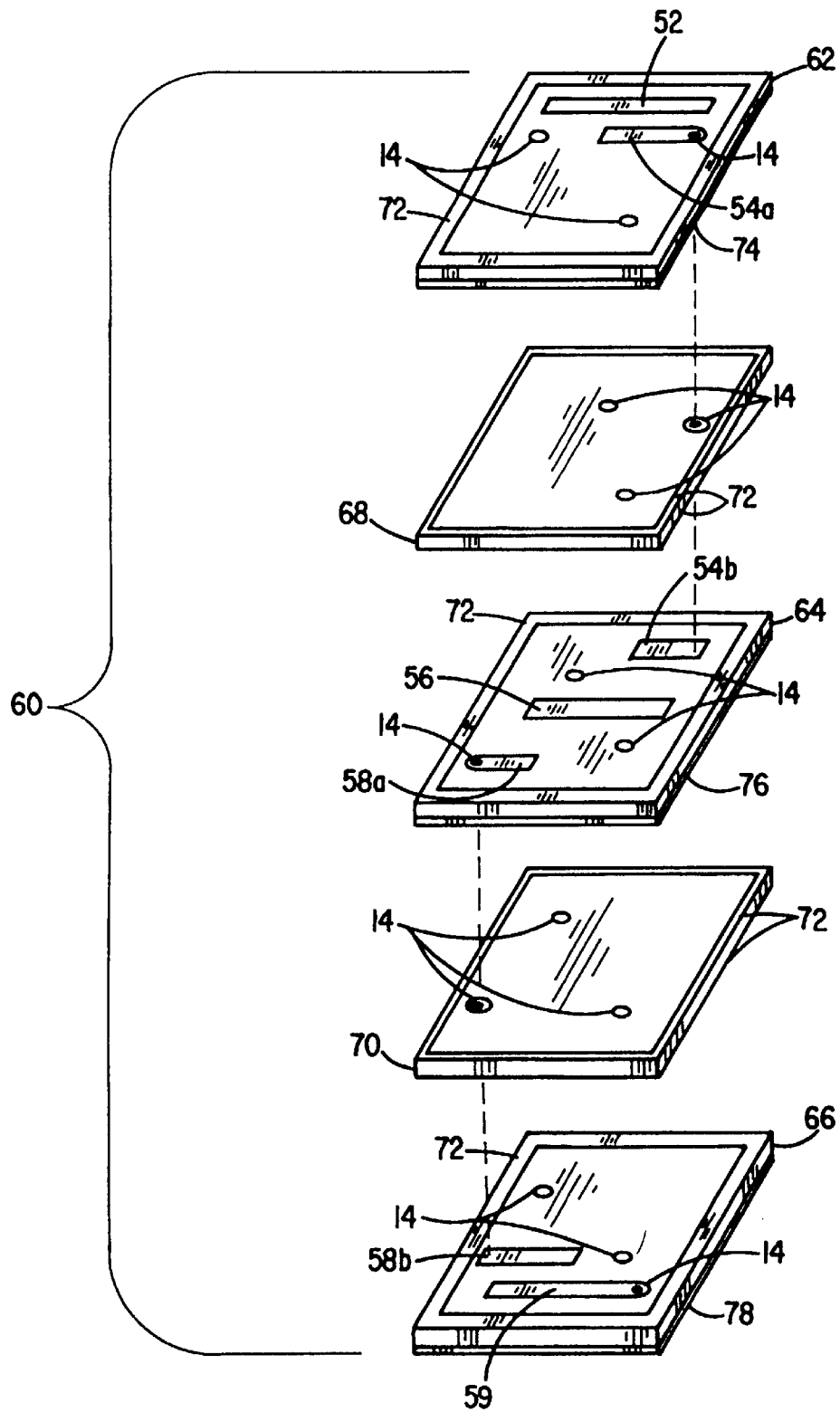
FIG. 6 is an exploded assembly view of a typical multi-layer, hermetically sealed circuit assembly of the invention shown without cover or bottom layers.

The transmission line delay line circuit 34 of FIG. 3 is formed on the upper surface of the layer 24 in the shape of a conductive serpentine pathway 36 and includes several parallel windings 38. The conductive pattern can exhibit an infinite number of configurations. The width and thickness of the transmission line pathway 36 is tailored in relation to the substrate material and thickness of the substrate material to provide a 50 ohm distributed impedance. The length of the transmission line pathway 36 controls the delay time. A second endless strip conductor 40 circumscribes the periphery of the pathway 36. A number of ground buss bars or terminations 42 extend from the strip conductor 40. Although FIGS. 1–3 depict an example of a two-layer delay line, longer delay times can be achieved by adding additional layers. The circuit diagram of FIG. 3 does not change when more layers are added to increase the delay time. Each additional transmission line or signal layer 24 is then isolated with an intervening ground layer 22 and the layers are interconnected with vias that extend through the layers. FIG. 6 shows an exemplary multi-layer oscillator circuit that can be constructed in accordance with the invention.

The bottom surface of the layer 24 supports a number of solder balls 46 that form the circuit terminations 1–13. The solder balls are arranged as a ball grid array (BGA) and define a relatively small footprint versus other leaded type terminations, such as "J" or gull wing shaped terminations. Some of the solder balls 46 are appropriately connected to the end terminations 3 and 10 of the transmission line pathway 36 with micro-vias or holes filled with conductive materials that extend through the ceramic substrates 26 and 28. The remaining solder balls 46 are separately connected with micro vias to the strip conductors 32 and 40, ground buss bars 42 and ground plane 30.

The ground plane 30, conductive pathway 36, strip conductors 32 and 40 and ground buss bars 42 are defined by a suitable conductive material (e.g. copper) that is plated over one or more thin film seed layers and an adhesion layer, such as NiCr, in conventional fashion. A variety of other conventional conductive materials can be used to equal advantage. All conductive depositions are suitably patterned by selective photo etching, plating and sputtering techniques.

Figure 4:
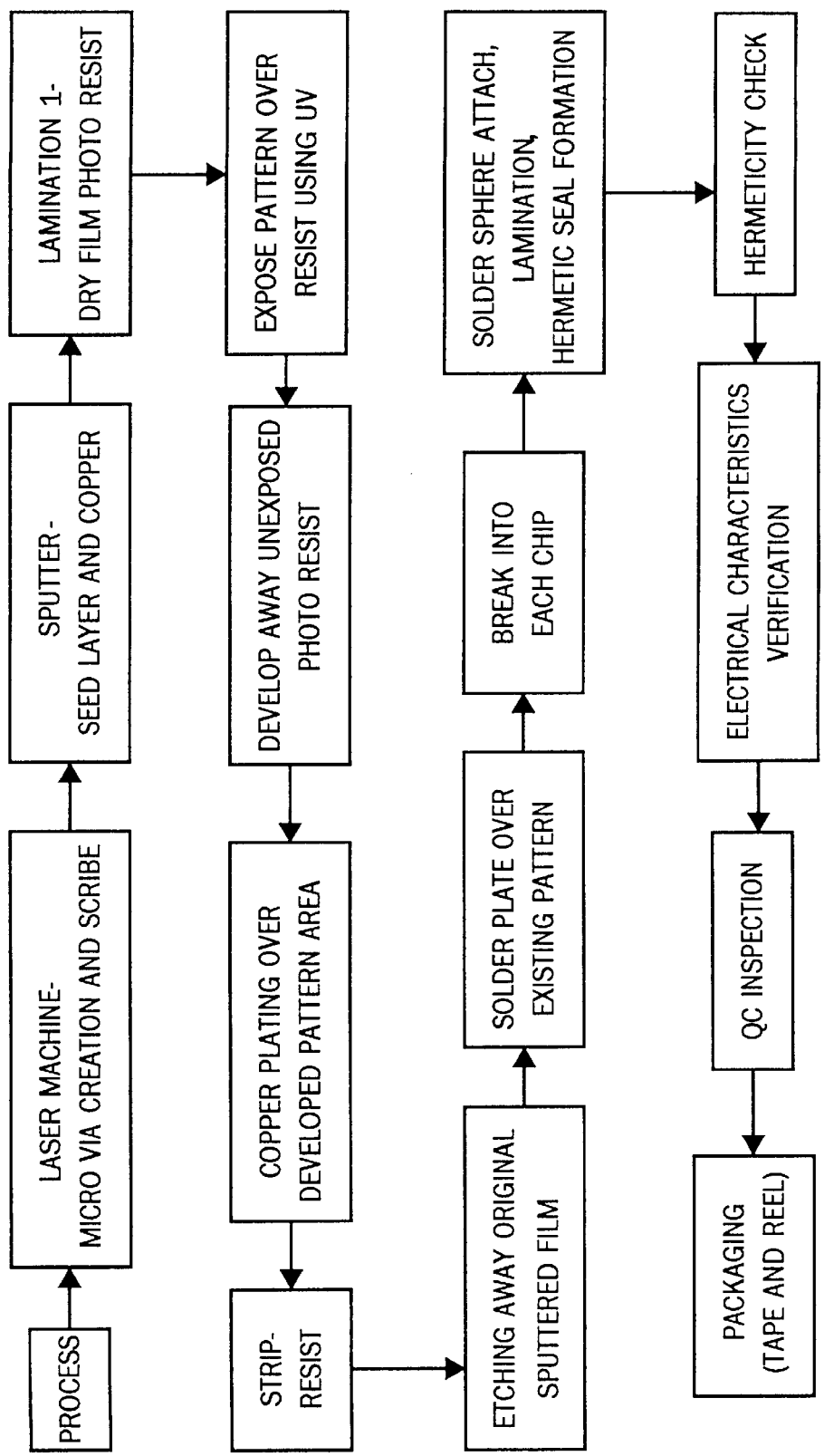
FIG. 4 is a typical flow chart of the assembly fabrication and sealing process used to achieve the hermetic seal between the circuit layers.

FIG. 4 depicts the general sequence of process steps used to construct the circuit assembly 20. First, the ceramic substrates 26 and 28 are drilled to form the micro vias through the substrates. The vias are located at the strip conductors 32 and 40, the connecting pads at the ends of the transmission line pathway 36 and ground buss bars 42. The substrates 26 and 28 are next etched with scribe lines using a $CO_2$ laser.

Thin film adhesion and copper seed layers are sputtered over both sides of the ceramic substrates 22 and 24. A dry film photo resist is laminated over both sides of the ceramic substrates 26 and 28. Patterned circuitry masks appropriate for each layer 22 and 24 are overlaid over the photo resist covered substrates 26 and 28 and exposed with UV light. Unexposed portions of the resist are developed away and copper is plated over developed pattern areas to a depth of approximately 25–30 um. The residue photo resist is removed and the substrates 26 and 28 are etched to remove all undesired sputtered thin film to leave only the desired copper plated conductor on the substrates 26 and 28.

The copper plated strip conductors 32 and 40 are next plated with a sealant material, such as solder. The sealant material can be any metal or metal alloy solder or other re-flowable material that can form a hermetic seal. A high temperature tin lead, Sn/Pb, solder sealant is used at the assembly 20 that has a high lead concentration and that is re-flowed under controlled time, pressure, temperature, and gas flow conditions in a graphite holder or boat and suitable oven, reference FIG. 5.

One or both of the strip conductors 32 and 40 can be coated with a re-flowable sealant. When the registered solder coated conductive strips 32 and 40 are exposed under suitable conditions, the solder re-flows and a hermetic seal is formed at the opposed surfaces of each pair of layers. Although single bands of strip conductors 32 and 40 provide a sufficient seal, any additional conductive bands or rings 48 can augment each seal. The strip conductors 32, 40 and/or 48 may also directly contact a ground pane, if the conductor height is deposited to provide a sufficient separation from any intervening conductors.

The prepared substrates 26 and 28 are next broken into pieces at the scribe lines. The solder balls 46 are next deposited.

The substrate layers 22 and 24 of a number of circuit assemblies (i.e. 96 parts) are then collated and aligned in proper registry in a graphite support fixture or boat. A cover of the boat includes a number of portions that are spring biased to apply a 1-pound force on each layered stack. The boat is mounted in a suitable chamber and coupled to an electrical source. Current is passed through the boat that acts as a resistor and provides proper heating. The solder plating at the overlapping solder covered strip conductors 32 and 40 is re-flowed and fused. The particular time, temperature and gas compositions used in the re-flow step are shown at FIG. 5

Figure 5:
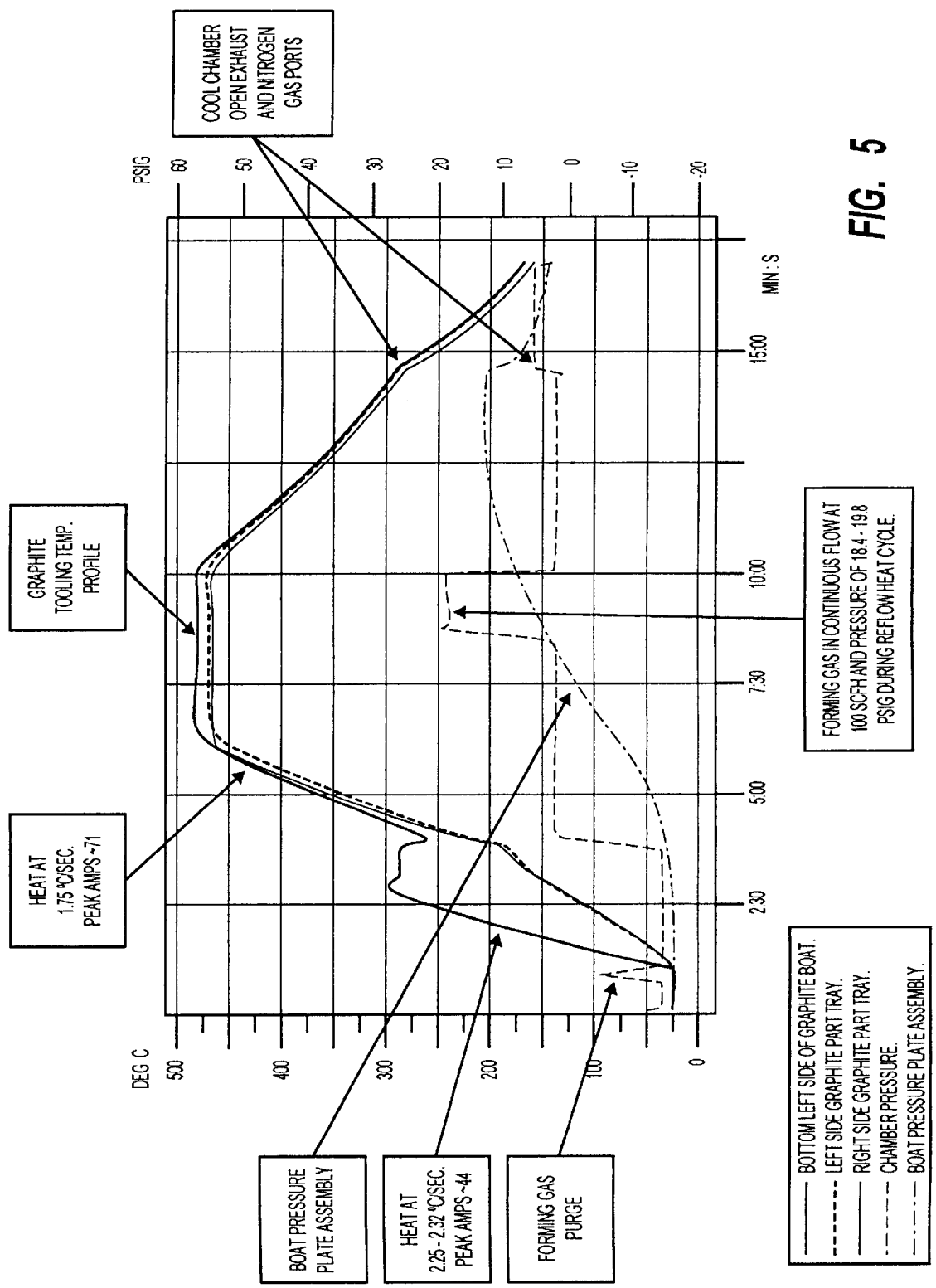
FIG. 5 is a notated graph (i.e. time, temperature and chamber gas/pressure) of the reflow process used to achieve the hermetic seal between the circuit layers.

With attention to the notated graph of FIG. 5 and after mounting the boat in the chamber, the chamber is evacuated and briefly purged with a suitable forming gas (e.g. 5% $H^2$ and 95% $N^2$). Current is applied to the boat at the start of a second purge sufficient to heat the boat at a rate on the order of 2.25–2.32° C./Sec. When the parts reach approximately 400° C. a continuous flow of forming gas is admitted to clean the exposed copper surfaces at the seal. Heating of the stacked layers is reinitiated at a rate of approximately 1.75° C./Sec to approximately 490° C. and the solder re-flows to the seal paths. After a suitable time, the cooling process is initiated. That is, current is disconnected from the boat and at approximately 10 minutes into the cycle, the exhaust and nitrogen gas ports are opened. Continuous streams of nitrogen and forming gas cool the parts over the next 5 minutes.

During the re-flow step of FIG. 5, the layers 22 and 24 at the layered circuit assemblies 20 are hermetically sealed together by re-flowing the solder sealant at the registered and overlapping strip conductors 32, 40 and/or 48. The seal encloses the transmission line pathway 36 in the interstitial space between the layers 22 and 24. The ground layer 30 and ground buss bars 42 are also connected to the strip conductors 32 and 40 at the micro-vias that extend through the ceramic substrates 26 and 28.

Continuing with the flow chart of FIG. 4, the hermetic seal of each assembly 20 is next verified with MIL-Std based bubble test or dye penetration tests. Each assembly 20 is then tested for proper electric performance, inspected and final packaged such as on a reeled tape. A separate hard cover may also be mounted to each assembly 20. The cover may be bonded to a suitable strip conductor 32 or 40.

FIG. 6 shows another multi-layer circuit assembly 60 that is defined by several signal layers 62, 64 and 66 and intervening dielectric layers 68 and 70. Solder plated, endless strip conductors 72 are formed on the layers 62–70 to appropriately register with each other and ground planes 74, 76 and 78. Numerous micro vias 14 are provided at the layers to interconnect the patterned signal conductors 52, 54*a,b*, 56, 58*a,b* and 59 and ground layers 74, 76 and 78 with the sealed strip conductors 72. During the solder reflow step, the strip conductors 72 bond to each other or the opposed ground plane 74, 76 or 78 to achieve the desired hermetic seal between each layer.

While the invention has been described with respect to presently preferred transmission line circuit assemblies, still other hermetic circuit assemblies can be constructed in accordance with the described invention. The following claims should therefore be construed to include all those equivalent embodiments within the scope thereof.

What is claimed is:

1. Circuit apparatus comprising a plurality of layers, wherein an electrical circuit is defined by a plurality of conductive paths deposited on a substrate of each of said plurality of layers and including at least one signal layer and means for interconnecting the conductive paths at said plurality of layers, wherein a first of two adjoining layers includes a surface having a conductive endless path circumscribing the periphery thereof, wherein said endless path is coated with a re-flowable sealant, wherein said conductive endless path is mounted to abut an adjoining conductive endless surface at a facing second layer, and wherein said sealant is re-flowed and bonded to said second layer, whereby said first and second layers are hermetically sealed together.

2. Circuit apparatus as set forth in claim 1 including a termination layer having a plurality of surface mount terminations coupled to said conductive paths and exposed at an external surface of one of said layers.

3. Circuit apparatus as set forth in claim 2 wherein said surface mount terminations comprise an array of ball-shaped terminations.

4. Circuit apparatus as set forth in claim 3 wherein said at least one signal layer includes a conductive path comprising a serpentine-shaped microstrip transmission line that exhibits a distributed impedance characteristic that defines a delay line.

5. Circuit apparatus as set forth in claim 4 including first and second ground layers positioned above and below said at least one signal layer.

6. Circuit apparatus as set forth in claim 5 wherein said first and second ground layers and said at least one signal layer are selectively and separately connected by metalized micro vias that extend through the supporting substrate of each layer.

7. Circuit apparatus as set forth in claim 1 wherein said conductive endless path and endless surface comprise rings of metal conductors formed to align in continuous registry about their respective circumferences and wherein at least one of said rings is coated with a re-flowable solder sealant.

8. Circuit apparatus as set forth in claim 1 wherein said conductive endless path and endless surface comprise a plurality of endless concentric rings formed to align in continuous registry and wherein a plurality of said rings are coated with a re-flowable solder sealant.

9. Circuit apparatus as set forth in claim 1 wherein said endless path comprises a conductive metal ring coated with a solder sealant and wherein said endless surface comprises a conductive ground plane.

10. Circuit apparatus as set forth in claim 1 wherein said first and second layers are selectively and separately connected by metalized micro vias that extend through the supporting substrate of each layer, wherein said conductive endless path and endless surface comprise a plurality of endless rings formed to align in continuous registry and wherein a plurality of said plurality of rings are coated with a re-flowable solder sealant.

11. Circuit apparatus comprising a plurality of layers, wherein an electrical circuit is defined by a plurality of conductive paths deposited on a substrate of each of said plurality of layers and including at least one signal layer having a conductive serpentine path and a ground layer having a conductive plane deposited to substantially cover a surface of said ground layer and a plurality of through vias for interconnecting the serpentine path and conductive plane at said plurality of layers, wherein said signal layer and ground layer include abutting surfaces having conductive endless rings circumscribing the periphery thereof, wherein said endless rings are coated with a re-flowable solder, wherein said conductive endless rings are mounted to abut one another, and wherein said sealant is re-flowed and said first and second layers are bonded together and the space between the rings is hermetically sealed.

12. Apparatus as set forth in claim 1 wherein the said endless rings are coupled to a circuit ground.

13. Circuit apparatus as set forth in claim 11 including a termination layer having an array of ball-shaped terminations at an external surface connected to said conductive paths.

14. Circuit apparatus as set forth in claim 13 wherein said serpentine path comprises a serpentine transmission line that exhibits a distributed impedance characteristic that acts as a delay line.

15. A method for constructing electrical circuit apparatus comprising:
   a) forming a plurality of layers, wherein an electrical circuit is defined by a plurality of conductive paths deposited on a substrate of each of said plurality of layers and including at least one signal layer having a conductive serpentine path and a ground layer having a conductive plane deposited to substantially cover a surface of said ground layer;
   b) forming a plurality of vias, wherein each via comprises a hole through one of said substrates filled with a conductive material, that interconnect with the serpentine path and conductive plane at said plurality of layers;
   c) forming a plurality of conductive endless rings about the periphery of said signal layer and ground layer;
   d) coating one of said endless rings with a re-flowable solder;
   e) stacking said plurality of layers and aligning said plurality of endless rings to abut one another; and
   f) re-flowing said solder to bond said endless rings to one another and hermetically seal the space between said endless rings and opposing substrates.

16. A method as set forth in claim 15 including forming an array of ball-shaped terminations at an external surface of one of said plurality of layers and connecting said ball-shaped terminations to said conductive paths with a plurality of said vias.

17. A method as set forth in claim 15 including mounting the stack of aligned layers in a graphite support fixture, positioning said support fixture in a gas chamber and exerting a constant compressive force on the stacked layers as said support fixture is heated and cooled.

18. A method as set forth in claim 17 including passing a plurality of gasses through said chamber as the stacked layers are heated and cooled.

19. A method for constructing electrical circuit apparatus comprising:
   a) forming first and second layers, wherein an electrical circuit is defined by a plurality of conductive paths deposited on a substrate of each of said first and second
   b) forming a conductive endless ring about the periphery of a surface of each of said first and second layers;
   c) coating one of said endless rings with a re-flowable sealant;
   d) stacking said first and second layers and aligning said endless rings to abut one another; and
   f) re-flowing said sealant to bond said endless rings to one another and hermetically seal the space between said endless rings and opposing layers.

* * * * *